US010674265B1

(12) United States Patent
Lee

(10) Patent No.: US 10,674,265 B1
(45) Date of Patent: Jun. 2, 2020

(54) BACKGROUND LEVEL DEPENDENT DYNAMIC VOLUME LEVELS

(71) Applicant: Google LLC, Mountain View, CA (US)

(72) Inventor: Jae Lee, Palo Alto, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/395,360

(22) Filed: Apr. 26, 2019

(51) Int. Cl.
H04R 3/04 (2006.01)
H04R 5/04 (2006.01)
G10L 21/0232 (2013.01)
H04R 5/027 (2006.01)
H03G 3/02 (2006.01)

(52) U.S. Cl.
CPC ............ *H04R 3/04* (2013.01); *G10L 21/0232* (2013.01); *H04R 5/027* (2013.01); *H04R 5/04* (2013.01); *H04R 2430/01* (2013.01)

(58) Field of Classification Search
CPC . H04R 3/04; H04R 5/027; H04R 5/04; H04R 5/033; H04R 25/70; H04R 3/00; H04R 1/1041; H04R 1/1083; H04R 19/04; H04R 2430/01; H04R 2201/107; H04R 2225/43; H04R 2225/55; H03G 3/32; H03G 3/02; G10L 21/0232; G06F 3/165
See application file for complete search history.

(56) References Cited

U.S. PATENT DOCUMENTS

| 8,964,998 | B1* | 2/2015 | McClain | ................... H03G 3/32 |
| | | | | 381/106 |
| 2005/0260978 | A1* | 11/2005 | Rader | .................... H04R 25/70 |
| | | | | 455/418 |
| 2012/0101819 | A1* | 4/2012 | Heiman | ................ H04R 1/1083 |
| | | | | 704/233 |
| 2012/0259441 | A1* | 10/2012 | Armstrong | ............... H03G 3/10 |
| | | | | 700/94 |
| 2014/0010377 | A1 | 1/2014 | Hsu et al. | |
| 2014/0079227 | A1 | 3/2014 | Kim et al. | |
| 2014/0140537 | A1 | 5/2014 | Soulodre | |
| 2015/0192915 | A1 | 7/2015 | Seo et al. | |
| 2016/0056781 | A1* | 2/2016 | Rose | ........................ H03G 3/02 |
| | | | | 381/107 |

FOREIGN PATENT DOCUMENTS

CN 109151634 A * 1/2019

OTHER PUBLICATIONS

International Search Report and Written Opinion for International Application No. PCT/US2019/062792 dated Feb. 7, 2020. 16 pages.

* cited by examiner

Primary Examiner — Yogeshkumar Patel
(74) Attorney, Agent, or Firm — Lerner, David, Littenberg, Krumholz & Mentlik, LLP

(57) ABSTRACT

A system and method for dynamically adjusting the quantity of volume levels and/or the loudness delta are disclosed. The quantity of volume levels may the number of increments between a minimum and maximum volume. The loudness delta may be the difference between adjacent volume levels. The device may one or more microphones to determine a background noise level. Based on the determined background noise level, and after receiving a user input to adjust the volume, the device may adjust the quantity of volume levels and/or the loudness delta depending on if the background noise level is increased or low.

20 Claims, 6 Drawing Sheets

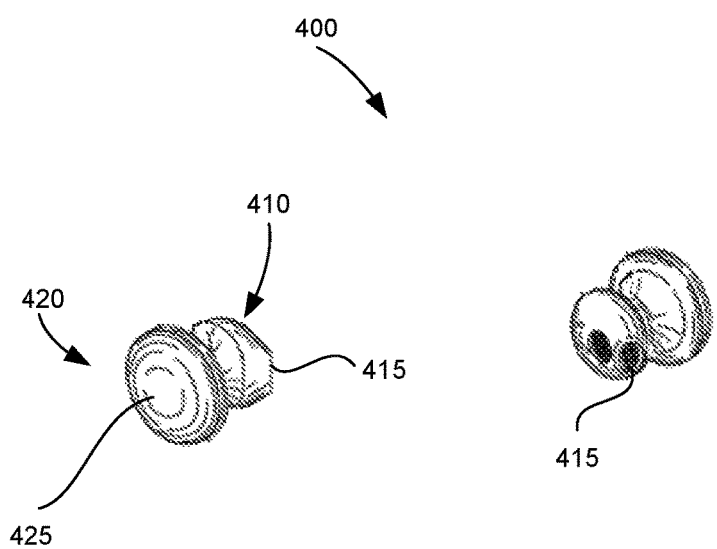
FIG. 4A
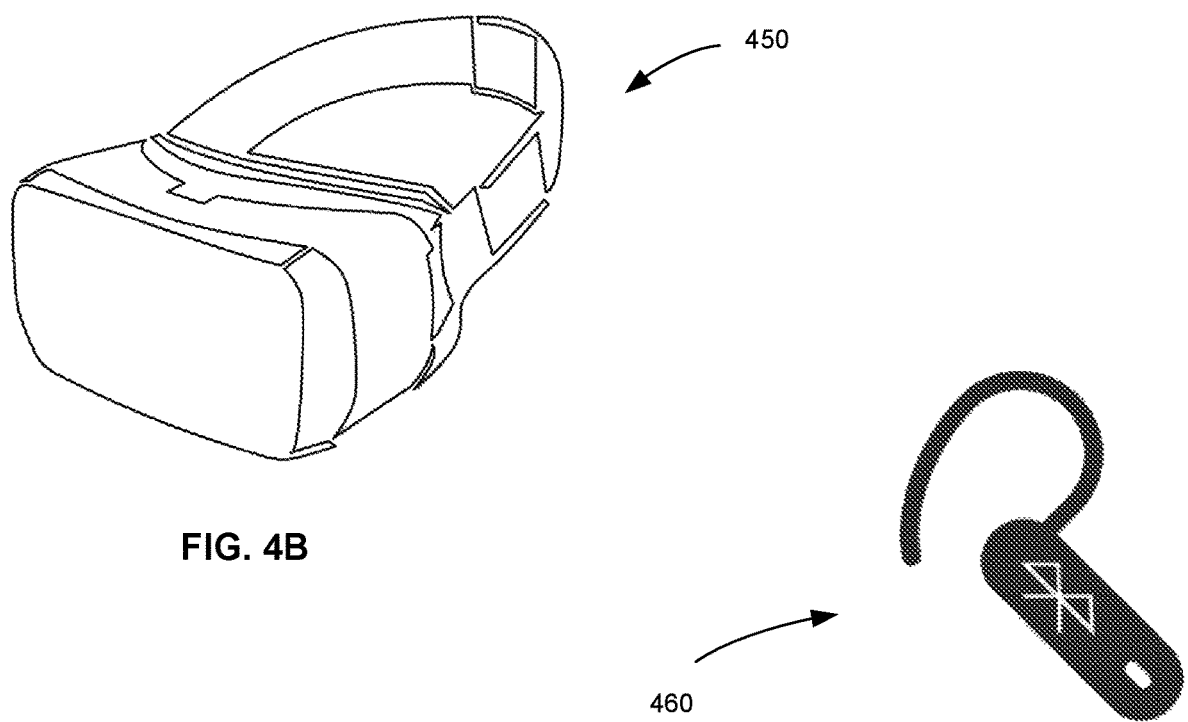
FIG. 4B
FIG. 4C

BACKGROUND LEVEL DEPENDENT DYNAMIC VOLUME LEVELS

BACKGROUND

Many devices, including earbuds, smartphones, and smartwatches, provide for sound playback. Each device may have a default quantity of increments between a minimum volume and a maximum volume. Each device may have a different default increase or decrease in volume from one increment to the next adjacent increment. In some instances, to change the volume coming from the device, a user may provide an input. The input may increase or decrease the volume one increment at a time. A user may have to provide numerous inputs to obtain a desired volume.

BRIEF SUMMARY

The present disclosure provides systems and methods for dynamically adjusting a quantity of volume levels and/or a loudness delta based on a background noise level.

One aspect of the disclosure provides for a device having one or more microphones, and one or more processors in communication with the one or more microphones.

According to one example, the one or more processors may be configured to determine a background noise level and adjust a quantity of volume levels based on the determined background noise level. The quantity of volume levels may be the total number of increments between a minimum volume and a maximum volume.

In another example, the one or more processors may be configured to adjust a loudness delta based on the determined background noise level. The loudness delta may be the difference between a first volume level and a second volume level.

In some instances, the quantity of volume levels may decrease in response to an increased background noise level or the quantity of volume levels may increase in response to a lower background noise level.

In some instances, the loudness delta may increase in response to an increased background noise level or the loudness delta may decrease in response to a lower background noise level.

Another aspect of the disclosure provides a method of dynamically adjusting a quantity of volume levels and a loudness delta. The method includes receiving a volume adjustment command for adjusting a volume, determining a background noise level, and determining a current playback volume. The method may further include adjusting, based on the determined background noise level and/or current playback volume, the quantity of volume levels. In some instances, the method may include adjusting the loudness delta. The method may also include adjusting the volume in response to a volume adjustment command.

BRIEF DESCRIPTION OF THE DRAWINGS

FIGS. 4A-4C illustrate example devices according to aspects of the disclosure.

DETAILED DESCRIPTION

Introduction

The systems and methods described herein relate to a device that may allow for dynamic adjustment of the quantity of volume levels and/or the loudness delta based on a background noise level. The device may have a default quantity of volume levels between a minimum volume and a maximum volume, where the default quantity is automatically adjusted to more or fewer volume levels depending on a background noise level when the device is in use. The volume levels may be, for example, incremental increases in volume between a minimum volume for the device and a maximum volume for the device. The difference between one volume level and an adjacent volume level is the loudness delta. The device may also have a default loudness delta. In some instances, the loudness delta may be measured in decibels ("dB") or decibels of sound pressure level ("dB SPL").

Figure 1A:
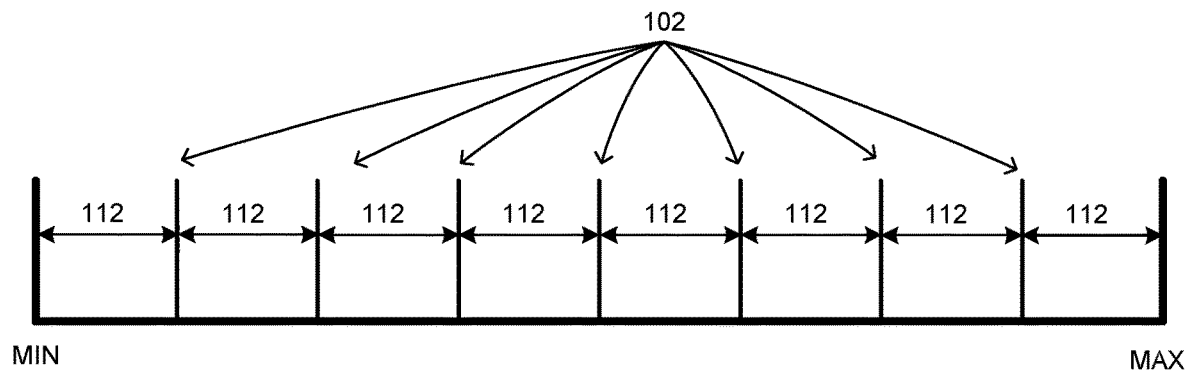
FIG. 1A-1C illustrate various example of quantities of volume levels and different loudness deltas according to aspects of the disclosure.

FIG. 1A illustrates a first quantity of volume levels, each with a first loudness delta. The first quantity of volume levels and first loudness delta, according to one example, may be the default quantity and default loudness delta. By way of example only, as shown in FIG. 1A, there are seven volume levels 102 between the minimum volume MIN and the maximum volume MAX. Between each adjacent volume level 102 may be a loudness delta 112. Accordingly, as a user enters input, such as a volume adjustment command, to adjust the volume level upwards or downwards, the volume output through the device will increase or decrease by the loudness delta 112. It should be understood that in other examples, the default quantity and the default loudness delta may be different.

Figure 1B:
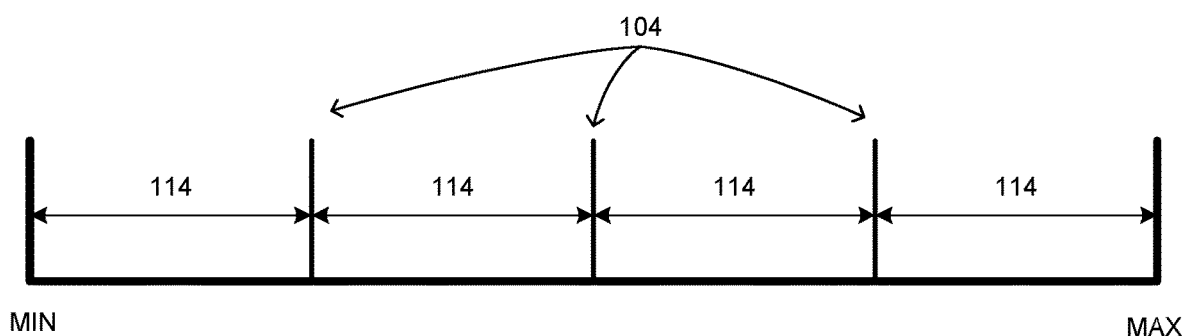

FIG. 1B illustrates the quantity of volume levels and the loudness delta when the device is in an environment with increased, or loud, background noise, according to one example. For example, when the background noise is increased, the quantity of volume levels 104 may decrease as compared to the default quantity of volume levels 102. According to some examples, the quantity of volume levels 104 may decrease to three between the minimum volume MIN and the maximum volume MAX, as compared to seven default volume levels 102. Further, according to some examples, the loudness delta 114 may increase as compared to the default loudness delta 112.

Figure 1C:
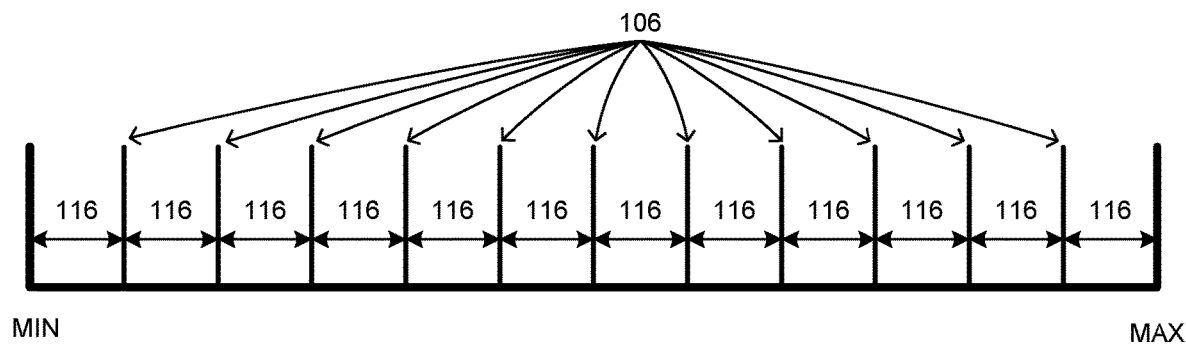

FIG. 1C illustrates an example of the quantity of volume levels and the loudness delta when in an environment with decreased, or low, background noise. For example, when the background noise level is low, or quiet, the quantity of volume levels 106 may decrease as compared to the default quantity of volume levels 102. According to some examples, the quantity of volume levels 106 may increase to eleven between the minimum volume MIN and the maximum volume MAX, as compared to seven default volume levels 102.

While FIGS. 1A-1C provide several examples of how the quantity of volume levels and/or the loudness deltas can change, it should be understood that any number of additional levels of adjustment are possible. By way of example only, background noise levels can be categories into a number of ranges. For example, three ranges may include:

(1) 0-30 dB; (2) 31-60 dB; and (3) 61 dB+. As another example, five ranges may include: (1) 0-20 db; (2) 21-40 dB; (3) 41-60 dB; (4) 61-80 dB; (5) 81 dB+. Each range may be associated with a different quantity of volume levels between the minimum and maximum outputs played by an audio accessory, or each range may be associated with a different loudness delta between each volume level between the minimum and maximum. Also, while each of FIGS. 1A-1C depict the loudness delta between each volume level as being the same (e.g., loudness deltas 112 are all the same; loudness deltas 114 are all the same, etc.), in some examples the loudness delta may vary from one pair of adjacent volume levels to another pair of adjacent volume levels.

Figure 2:
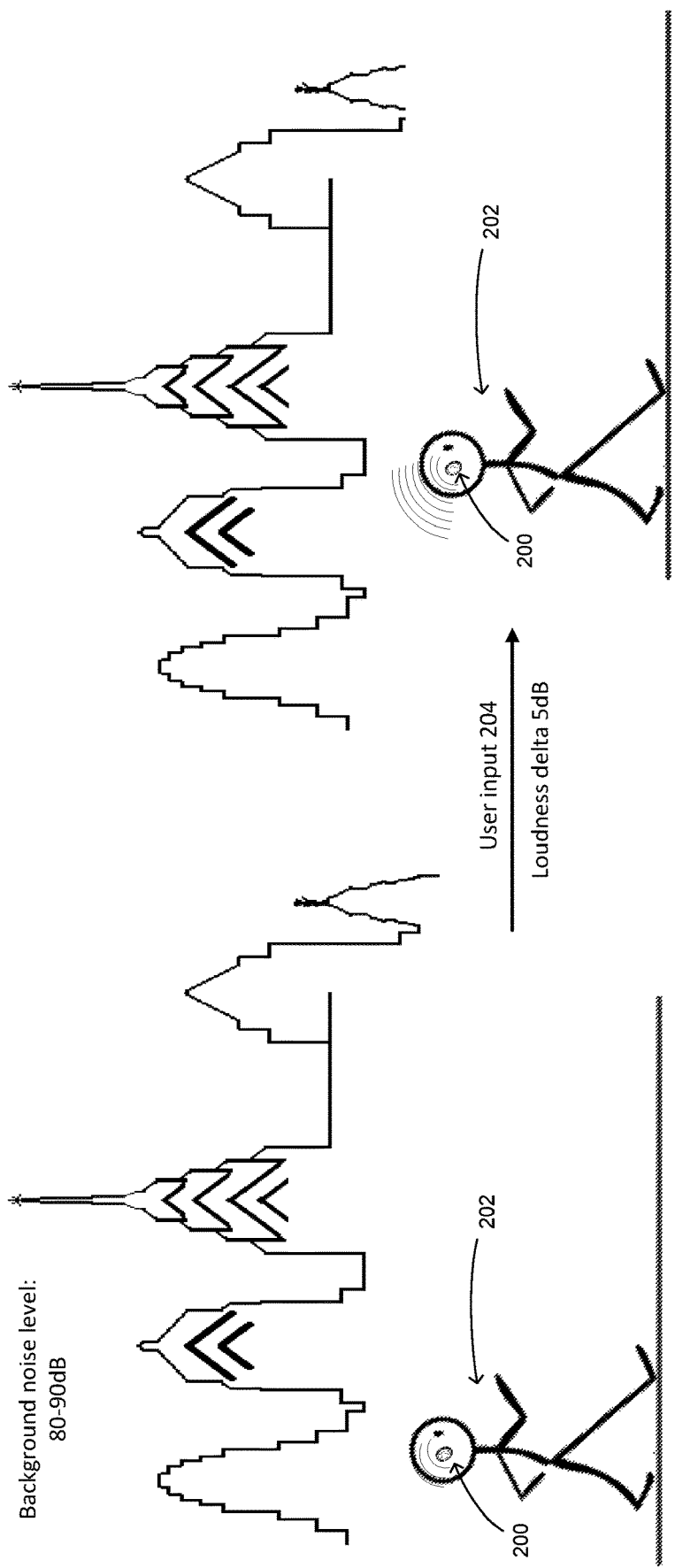
FIG. 2 is a pictorial diagram according to aspects of the disclosure.

FIG. 2 illustrates the dynamic adjustment of the quantity of volume levels and loudness delta in a location with an increased or relatively loud background noise level. For example, in a city setting, the background noise level may be between 80-90 dB. In some instances, a user 202 may increase the playback volume to hear the output better. However, when the user 202 is walking in an area with increased noise level, such as the city, it may be burdensome for the user 202 to provide an input command multiple times to adjust the playback volume from their earbuds 200. For example, where volume adjustment is performed with a tap, swipe, or the like, the user 202 may not want to provide numerous taps, swipes, etc. to achieve an audible playback level through the audio device. For example, the user 202 may provide one or two input commands to reach a desired volume, instead of eight or twelve. Accordingly, when user 202 provides a user input 204 to the earbuds 200, the quantity of volume levels and the loudness delta may dynamically adjust to decrease the quantity of volume levels and increase the loudness delta, as seen in comparing FIG. 1A and FIG. 1B. For example, the default loudness delta may be 3 dB. However, in response to the increased background noise level of the city, the loudness delta may be 5 dB, an increase of 2 dB from the default. Therefore, according to some examples, this may result in requiring fewer user inputs to reach the desired volume. As mentioned above, these are merely examples, and the change in quantity of volume levels or loudness delta may be more or less. For example, the loudness delta may change from 3 dB to 8 dB, or the quantity of volume levels may change from 10 to 5, etc.

Figure 3:
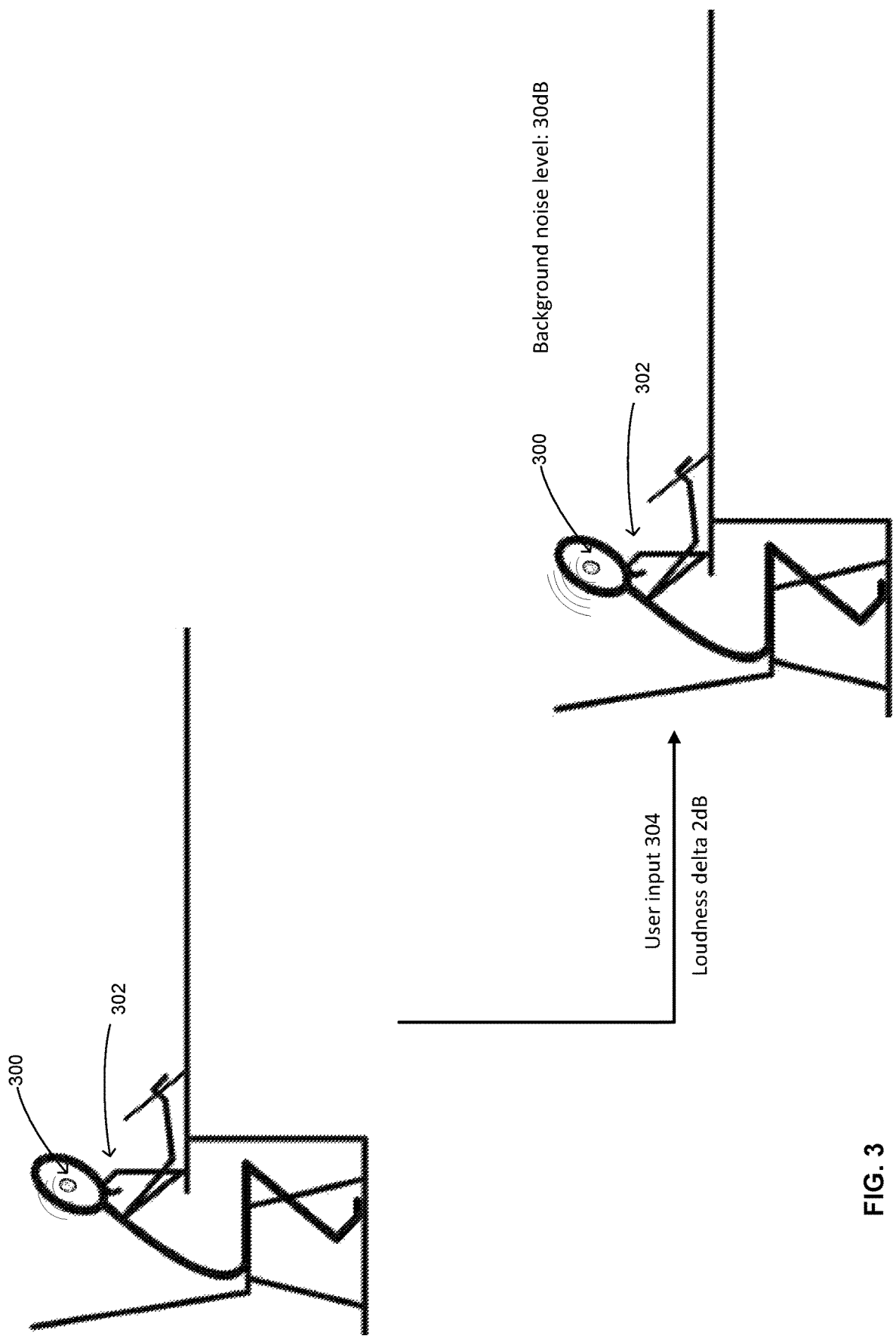
FIG. 3 is a pictorial diagram according to aspects of the disclosure.

FIG. 3 illustrates the dynamic adjustment of the quantity of volume levels and the loudness delta in a location with a decreased, or relatively quiet or low, background noise level. For example, in a library setting, the background noise level may be 30 dB. In some instances, the user 202 may increase the playback volume to hear the output better. However, when the user 302 is in an area with low background noise level, such as a library, the user 202 may provide an input command multiple times to adjust the playback volume from their earbuds 200. For example, where volume adjustment is performed with a tap, swipe, or the like, the user 202 may provide numerous taps, swipes, etc. to achieve the desired playback volume level through the device. The user 202 may provide numerous taps, swipes, etc. to achieve an audible playback level through the audio device. According to some examples, the user 202 may provide one or two input commands to reach a desired volume, instead of eight or twelve. Accordingly, when a user 302 provides a user input 304 to the earbuds 300, the quantity of volume levels and the loudness delta may dynamically adjust to increase the quantity of volume levels and decrease the loudness delta between adjacent volume levels, as seen in comparing FIG. 1A and FIG. 1C. According to some examples, the default loudness delta may be 3 dB. However, in response to a low background noise level the loudness delta may be 2 dB. This may result in requiring more user inputs 304 to reach a desired playback volume. In some instances, the volume delta may be smaller which may allow for a user to more easily select the appropriate, or preferred, playback volume in a setting with a low background noise level. As mentioned above, these are merely examples, and the change in quantity of volume levels or loudness delta may be more or less. For example, the loudness delta may change from 3 dB to 1 dB, or the quantity of volume levels may change from 5 to 10, etc.

By way of further example (not shown), a user transition from a first location with a relatively loud background noise level to a second location with a decreased background noise level. Thus, in response to a user input, the device may dynamically adjust quantity of volume levels and the loudness delta. The dynamic adjustment, for example, may be seen as a transition from the quantity of volume levels and the loudness delta shown FIG. 1B to those shown in FIG. 1C. For instance, the quantity of volume levels may increase and the loudness delta may decrease. The change in the quantity of volume levels may be more going from a location with a relatively loud background noise level to a location with a relatively low background noise level, e.g., FIG. 1B where there are 3 volume levels to FIG. 1C where there are 11 volume levels, as compared to when a user goes from default quantity of volume levels to area location with a relatively low background noise level, e.g., FIG. 1A where there are 7 volume levels to FIG. 1C where there are 11 volume levels. The same comparison may apply for the adjustment of the loudness delta. For example, the difference between the loudness delta when in a location with a relatively loud background noise level to a loudness delta in a location with a relatively low background noise level may be greater than the difference between the default loudness delta and the loudness delta in a low background noise level.

In another example (not shown), a user may transition from a first location with a relatively low background noise level to a second location with an increased background noise level as compared to the first location. Thus, in response to a user input, the device may determine the background noise level may be determined as well as the current playback volume. Based on the determined background noise level and current playback volume, the device may dynamically adjust the quantity of volume levels and the loudness delta. When transitioning from a location with a relatively low background to a location with an increased background noise level, the dynamic adjustment, for example, may be seen as a transition from the quantity of volume levels and the loudness delta shown in FIG. 1C to those shown in FIG. 1B. For instance, the quantity of volume levels may decrease and the loudness delta may increase.

Example Systems

FIG. 4A illustrates an example device capable of dynamically adjusting the quantity of volume levels based on the background noise level. In this example, the device 400 is a pair of earbuds. However, in other examples, any of a variety of other devices may be used, such as augmented reality and/or virtual reality headsets 450 (FIG. 4B), Bluetooth enabled headsets 460 (FIG. 4C), glasses, head-mountable displays, smart watches, mobile phones and/or smart phones, tablets, music players, game consoles, motorcycle helmets, etc.

The device 400 may be configured to wirelessly couple with another device, such as a phone, laptop, tablet, music player, or the like. The wireless coupling may be established using any of a variety of techniques, such as Bluetooth, Bluetooth low energy (BLE), etc. In other examples, the device 400 may be configured to output audio independent of a connection to another device. For example, the device 400 may include a memory for storing audio content, may stream audio content from the cloud, etc.

The device 400 may include an inner portion 410, for being inserted into a user's ear. The inner portion may include inner microphone 415 and an output, or speaker, not shown, at or near the same location as inner microphone 415. The device 400 may also include an outer portion 420 which may include an outer surface 425.

Functions of the device 400 may be manipulated by touch input. For example, touch input may be provided to an outer portion 420, such as to outer surface 425. Such touch input may, by way of example only, switch the device 400 to a different mode, such as an input mode where user's voice is detected as opposed to a sound emission only mode. As further examples, the touch input may change a song being played, adjust volume, switch from a music player mode to answer an incoming call, etc. The device 400 may be adapted to perform a plurality of different functions, detecting which function is desired based on a duration of the touch input. For example, whereas a held touch may place the device 400 into voice reception mode, a short tap may change a song being played, and a swipe may increase or decrease the volume.

Figure 5:
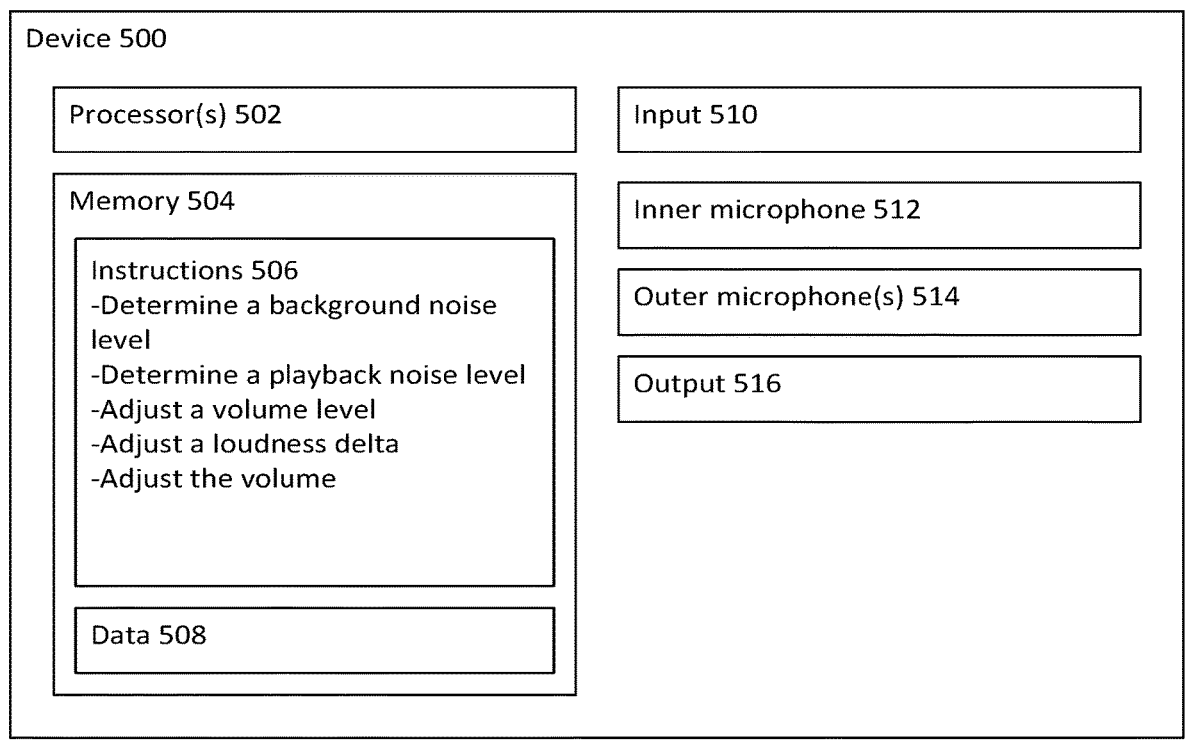
FIG. 5 is a block diagram illustrating an example device according to aspects of the disclosure.

FIG. 5 provides an example block diagram illustrating components of the device 500. As shown, the device 500 includes various components, such as one or more processors 502, memory 504, and other components typically present in microprocessors, general purpose computers, or the like. Device 500 also includes input 510, an inner microphone 512, one or more outer microphones 514 and an output 516.

The one or more processors 502 may be any conventional processors, such as commercially available microprocessors. Alternatively, the one or more processors may be a dedicated device such as an application specific integrated circuit (ASIC) or other hardware-based processor. Although FIG. 5 functionally illustrates the processor, memory, and other elements of device 500 as being within the same block, it will be understood by those of ordinary skill in the art that the processor, computing device, or memory may actually include multiple processors, computing devices, or memories that may or may not be stored within the same physical housing. Similarly, the memory may be a hard drive or other storage media located in a housing different from that of device 200. Accordingly, references to a processor or computing device will be understood to include references to a collection of processors or computing devices or memories that may or may not operate in parallel.

Memory 504 may store information that is accessible by the processors 502, including instructions 506 that may be executed by the processors 502, and data 508. The memory 504 may be of a type of memory operative to store information accessible by the processors 502, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions 506 and data 508 are stored on different types of media.

Data 508 may be retrieved, stored or modified by processors 502 in accordance with the instructions 506. For instance, although the present disclosure is not limited by a particular data structure, the data 508 may be stored in computer registers, in a relational database as a table having a plurality of different fields and records, XML documents, or flat files. The data 508 may also be formatted in a computer-readable format such as, but not limited to, binary values, ASCII or Unicode. By further way of example only, the data 508 may be stored as bitmaps comprised of pixels that are stored in compressed or uncompressed, or various image formats (e.g., JPEG), vector-based formats (e.g., SVG) or computer instructions for drawing graphics. Moreover, the data 508 may comprise information sufficient to identify the relevant information, such as numbers, descriptive text, proprietary codes, pointers, references to data stored in other memories (including other network locations) or information that is used by a function to calculate the relevant data.

The instructions 506 can be any set of instructions to be executed directly, such as machine code, or indirectly, such as scripts, by the processor 502. In that regard, the terms "instructions," "application," "steps," and "programs" can be used interchangeably herein. The instructions can be stored in object code format for direct processing by the processor, or in any other computing device language including scripts or collections of independent source code modules that are interpreted on demand or compiled in advance. Functions, methods and routines of the instructions are explained in more detail below.

The device 500 may further include an input 510 for receiving volume adjustment commands. The input 510 may be, for example, a touch sensor. The device 500 may also include an output 516. The output 516 may be, for example, a speaker.

Device 500 may have one or more microphones in a variety of locations. For example, inner microphone 512 may be located such that it can determine a playback volume. According to some embodiments, there may be one or more outer microphones 514 located on the exterior of device 500. Outer microphones 514 may be able to detect background noise. The outer microphones 514 may also be able to detect sound to be processed by the one or more processors within device 500 and transmit the sound to another device.

It should be understood that the device 500 may include other components which are not shown, such as a battery, charging input for the battery, signals processing components, etc. Such components may also be utilized in execution of the instructions 506.

Example Methods

Figure 6:
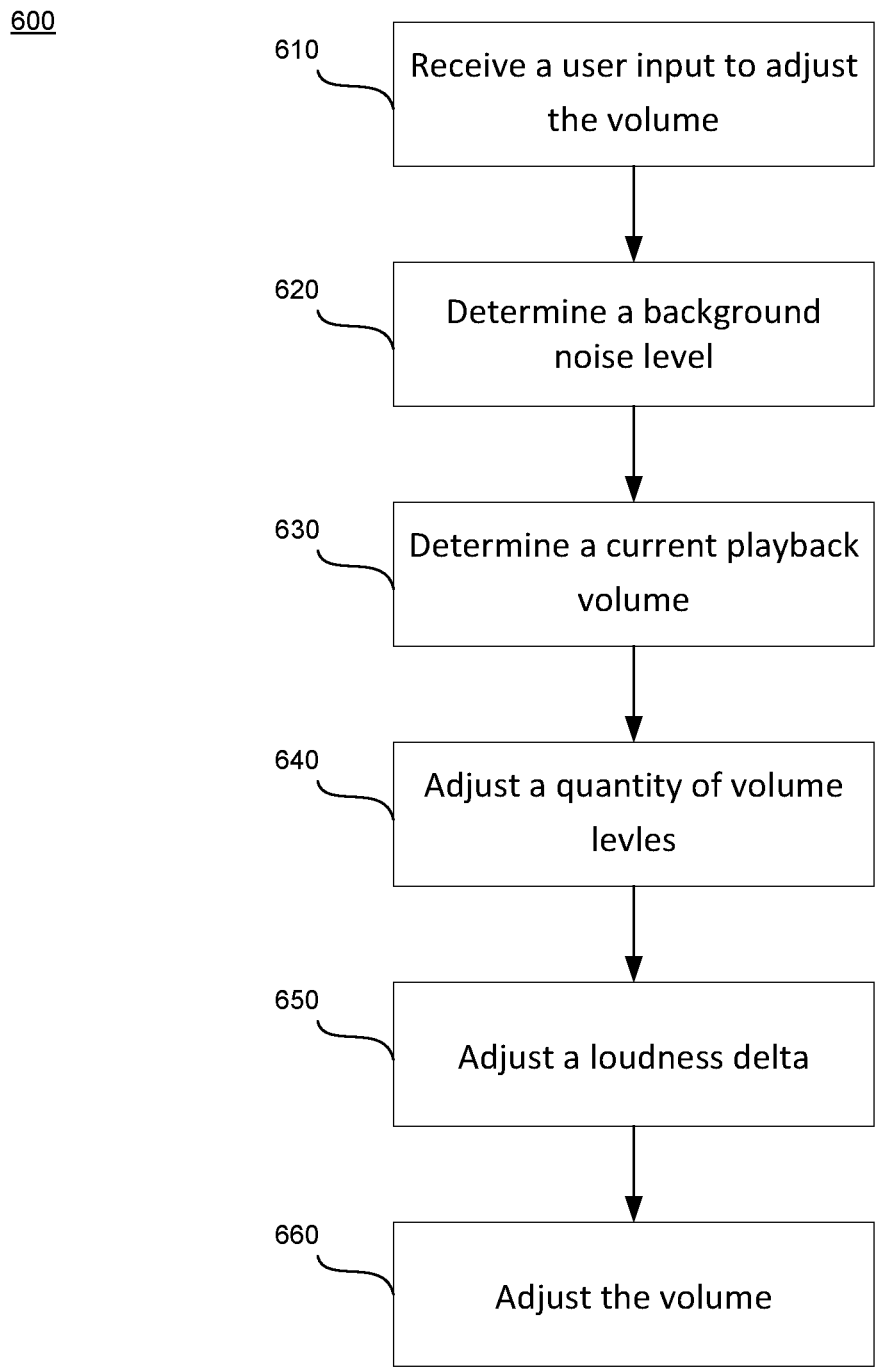
FIG. 6 is a flow diagram illustrating an example method in accordance with aspects of the disclosure.

FIG. 6 illustrates a sequence of steps that may occur when the device dynamically adjusts the quantity of volume steps and/or the loudness delta. For example, in block 610, the device may receive volume adjustment commands to adjust the volume. The device may include at least one or more touch sensors for generating volume adjustment commands. The volume adjustment command may, in some examples, be generated by a touch input. In some instances, a user may swipe the input in a particular direction to increase the volume or swipe in a different direction to decrease the volume.

In block 620, after receiving the volume adjustment commands, the device may determine a background noise level. The one or more microphones may be listening to the background noise. According to some examples, the outer microphone(s) may be listening to the background noise. In other examples, the inner microphone may be listening to the background noise. The background noise picked up by the one or more microphones may then be processed to determine the outside noise level. For example, the background noise level in a quiet place, such as a library, may be 30 dB. Alternatively, the background noise level in a busy place, such as on a city street, may be between 80-90 dB. Further, the background noise level may be 90 dB and above when the user is performing a noisy activity, such as mowing the lawn using a gas powered lawnmower or attending a concert.

Further, in block 630, the device may have one or more microphones to determine a current playback volume. According to some examples an inner microphone may determine the current playback volume. In other examples, the outer microphone(s) may determine the current playback volume. While determining the current playback volume is shown as occurring after determining the background noise level, determining the current playback volume may occur before or at the same time the background noise level is determined. The one or more microphone(s) may be listening to what the user may hear. The playback volume picked up by the one or more microphone(s) may then be processed to determine the playback volume.

Having one or more microphones may help prevent false triggers. A false trigger may include the device dynamically adjusting the quantity of volume levels and/or the loudness delta when it is unwanted or unnecessary. According to some examples, the device may compare the background noise level picked up by the outer microphone and the playback volume picked up by the inner microphone. For example, the comparison of the background noise level and the playback volume may allow the device to differentiate between a user who is a loud talker and a user who is talking loud to be heard over the loud background noise level. This may prevent the device from dynamically adjusting the quantity of volume levels and/or the loudness delta when it is unnecessary. In some instances, the device may compare the sound heard by any two microphones on the device, such as two outer microphones, to prevent a false trigger.

Once the device has determined a background noise level and a current playback volume, in block 640, the device may adjust a quantity of volume levels. According to one example, when the background noise level is increased, the quantity of volume levels may decrease. Alternatively, when the background noise level is decreased, the quantity of volume levels may increase. In the example where the user is a loud talker, the device may not adjust the quantity of volume levels. However, in the example where the user is talking loud to be heard over the loud background noise level, the quantity of volume levels may decrease.

The device, in block 650, may adjust a loudness delta. The loudness delta may be adjusted at the same time, before, or after the quantity of volume levels is adjusted. The device may adjust a loudness delta without adjusting the quantity of volume levels. Alternatively, the device may not adjust a loudness delta and may only adjust the quantity of volume levels. In some instances when the loudness delta is adjusted, the loudness delta may increase when the determined background noise level has increased. Alternatively, when the background noise level decreases, the loudness delta may decrease. In the example where the user is a loud talker, the device may not adjust the loudness delta. However, in the example where the user is talking loud to be heard over the loud background noise level, the loudness delta may increase.

In block 660, the device may adjust the volume.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A device, comprising:
   one or more microphones; and
   one or more processors in communication with the one or more microphones, the one or more processors being configured to:
      receive volume adjustment commands;
      determine a background noise level; and
      adjust a quantity of volume levels based on the determined background noise level, the quantity of volume levels being a total number of increments between a minimum volume and a maximum volume.

2. The device of claim 1, wherein adjusting the quantity of volume levels comprises dynamically adjusting a loudness delta as the background noise level changes, the loudness delta being the difference between a first volume level and a second adjacent volume level that is obtained in response to a single volume adjustment command.

3. The device of claim 2, wherein the quantity of volume levels decreases in response to an increased background noise level or the quantity of volume levels increases in response to a lower background noise.

4. The device of claim 2, wherein the loudness delta increases in response to an increased background noise level or the loudness delta decreases in response to a lower background noise level.

5. The device of claim 1, wherein the one or more microphones includes an inner microphone that detects a volume heard by a user.

6. The device of claim 1, wherein the one or more microphones includes an outer microphone that detects the background noise level.

7. The device of claim 1, wherein the device further comprises at least one or more touch sensors for generating volume adjustment commands.

8. A device, comprising:
   one or more microphones; and
   one or more processors in communication with the one or more microphones, the one or more processors being configured to:
      receive volume adjustment commands;
      determine a background noise level; and
      adjust a loudness delta based on the determined background noise level, the loudness delta being the difference between a first volume level and a second adjacent volume level that is obtained in response to a single volume adjustment command, the loudness delta being consistent between each of the adjacent volume levels.

9. The device of claim 8, wherein adjusting a loudness delta comprises adjusting a quantity of volume levels as the background noise level changes, the quantity of volume levels being a total number of increments between a minimum volume and a maximum volume.

10. The device of claim 9, wherein the quantity of volume levels decreases in response to an increased background noise level.

11. The device of claim 9, wherein the quantity of volume levels increases in response to a lower background noise level.

12. The device of claim 8, wherein the loudness delta increases in response to an increased background noise level.

13. The device of claim 8, wherein the loudness delta decreases in response to a lower background noise level.

14. The device of claim 8, wherein the one or more microphones includes an inner microphone that detects a volume heard by a user.

15. The device of claim 8, wherein the one or more microphones includes an outer microphone that detects the background noise level.

16. The device of claim 8, wherein the device further comprises at least one or more touch sensors for generating volume adjustment commands.

17. A method, comprising:
receiving a volume adjustment command;
determining a background noise level;
determining a current playback volume; and
adjusting, based on the determined background noise level, at least one of a quantity of volume levels, the quantity of volume levels being a total number of increments between a minimum volume and a maximum volume, or a loudness delta, the loudness delta being the difference between a first volume level and a second adjacent volume, the loudness delta being consistent between each of the adjacent volume levels.

18. The method of claim 17, further comprising the steps of:
decreasing the quantity of volume levels in response to an increased background noise level or increasing the quantity of volume levels in response to a lower background noise level; and
increasing the loudness delta in response to the increased background noise level or decreasing the loudness delta in response to the lower background noise level.

19. The method of claim 17, wherein determining the background noise level is based on a noise level detected by one or more microphones, the one or more microphones including an inner microphone that detects a volume heard by a user and an outer microphone that detects the background noise level.

20. The method of claim 17, further comprising the step of adjusting the volume in response to a user input.

* * * * *